United States Patent
D'Souza et al.

(10) Patent No.: US 7,557,605 B2
(45) Date of Patent: Jul. 7, 2009

(54) HETEROGENEOUS CONFIGURABLE INTEGRATED CIRCUIT

(75) Inventors: Godfrey P. D'Souza, Santa Clara, CA (US); Douglas Laird, Los Gatos, CA (US); Malcolm J. Wing, Palo Alto, CA (US); Colin N. Murphy, Belmont, CA (US); Dana L. How, Palo Alto, CA (US); Robert Yu, Newark, CA (US); Jay B. Patel, Los Gatos, CA (US); Ivo Dobbelaere, Los Altos, CA (US); Jason Golbus, Campbell, CA (US); Suresh Subramaniam, Palo Alto, CA (US); Mukunda Krishnappa, Cupertino, CA (US); Pohrong R. Chu, Saratoga, CA (US); Dave Trossen, Santa Clara, CA (US); Kevin James, Santa Clara, CA (US)

(73) Assignee: Cswitch Corporation, Santa Clara, CA (US)

( * ) Notice: Subject to any disclaimer, the term of this patent is extended or adjusted under 35 U.S.C. 154(b) by 0 days.

(21) Appl. No.: 11/855,666

(22) Filed: Sep. 14, 2007

(65) Prior Publication Data

US 2009/0072858 A1    Mar. 19, 2009

(51) Int. Cl.
*H03K 19/173* (2006.01)
(52) U.S. Cl. .............................. 326/38; 326/41; 326/47
(58) Field of Classification Search ............. 326/37–41, 326/47; 370/252, 386, 412; 714/725; 716/16, 716/17
See application file for complete search history.

(56) References Cited

U.S. PATENT DOCUMENTS

| | | | |
|---|---|---|---|
| 6,862,724 B1* | 3/2005 | Riley et al. ..................... 716/17 |
| 2002/0163909 A1* | 11/2002 | Sarkinen et al. .............. 370/386 |
| 2004/0151197 A1* | 8/2004 | Hui ............................. 370/412 |
| 2005/0193357 A1* | 9/2005 | Honary et al. ................ 716/17 |
| 2007/0091816 A1* | 4/2007 | Lee et al. ..................... 370/252 |

* cited by examiner

*Primary Examiner*—James Cho
*Assistant Examiner*—Jany Tran
(74) *Attorney, Agent, or Firm*—Osha • Liang LLP

(57) ABSTRACT

A system including a plurality of programmable logic blocks, a plurality of special-purpose blocks, and a configurable high-speed mesh interconnect fabric operatively connecting the plurality of programmable logic blocks and the plurality of special-purpose blocks, where the configurable high-speed mesh interconnect fabric is configured to implement a plurality of interconnect pipeline buses spanning across the system.

11 Claims, 7 Drawing Sheets

HETEROGENEOUS CONFIGURABLE INTEGRATED CIRCUIT

CROSS-REFERENCE TO RELATED APPLICATIONS

The present application contains subject matter that may be related to the subject matter in U.S. application Ser. No. 11/901,182 entitled: "High-Bandwidth Interconnect Network for an Integrated Circuit", filed on Sep. 14, 2007, and assigned to the assignee of the present application.

The present application also contains subject matter that may be related to the subject matter in U.S. application Ser. No. 11/855,697 entitled: "System and Method for Parsing Frames", filed on Sep. 14, 2007, and assigned to the assignee of the present invention.

The present application also contains subject matter that may be related to the subject matter in U.S. application Ser. No. 11/855,721 entitled: "Reconfigurable Content-Addressable Memory", filed on Sep. 14, 2007, and assigned to the assignee of the present invention.

The present application also contains subject matter that may be related to the subject matter in U.S. application Ser. No. 11/855,740 entitled: "Memory Controller for Heterogeneous Configurable Integrated Circuit", filed on Sep. 14, 2007, and assigned to the assignee of the present invention.

The present application also contains subject matter that may be related to the subject matter in U.S. application Ser. No. 11/855,761 entitled: "General Purpose Input/Output System and Method", filed on Sep. 14, 2007, and assigned to the assignee of the present invention.

All mentioned U.S. applications are hereby incorporated by reference.

BACKGROUND

Digital systems can be implemented using off-the-shelf integrated circuits. However, system designers can often reduce cost, increase performance, or add capabilities by employing in the system some integrated circuits whose logic functions can be customized. Two common kinds of customizable integrated circuits in digital systems are application-specific integrated circuits (ASICs) and field-programmable gate arrays (FPGAs).

ASICs are designed and manufactured for a particular application. An ASIC includes circuits selected from a library of small logic cells. A typical ASIC also includes large special-purpose blocks that implement widely-used functions, such as a multi-kilobit random-access memory (RAM) or a microprocessor. The logic cells and special-function blocks must be placed at suitable locations on the ASIC and connected by means of wiring.

Application-specific integrated circuits (ASICs) have several advantages. As an ASIC contains only the circuits required for the application, it has a small die size. An ASIC also has low power consumption and high performance. However, ASICs have some disadvantages. It takes a lot of time and money to design ASICs because the design process is complex. Creating prototypes for an ASIC is complex as well, so prototyping also takes a lot of time and money.

Field-programmable gate arrays (FPGAs) are another kind of customizable integrated circuit that is common in digital systems. An FPGA is general-purpose device. It is meant to be configured for a particular application by the system designer.

Field-programmable gate arrays (FPGAs) have advantages over application-specific integrated circuits (ASICs). Prototyping an FPGA is a relatively fast and inexpensive process. Also, it takes less time and money to implement a design in an FPGA than to design an ASIC because the FPGA design process has fewer steps.

FPGAs have some disadvantages, the most important being die area. Logic blocks require more area than the equivalent ASIC logic cells, and the switches and configuration memory bits in routing crossbars (XBARs) require far more area than the equivalent wiring of an ASIC. FPGAs also have higher power consumption and lower performance than ASICs.

SUMMARY

In general, in one aspect, the invention relates to a system. The system includes a plurality of programmable logic blocks, a plurality of special-purpose blocks, and a configurable high-speed mesh interconnect fabric operatively connecting the plurality of programmable logic blocks and the plurality of special-purpose blocks, where the configurable high-speed mesh interconnect fabric is configured to implement a plurality of interconnect pipeline buses spanning across the system.

In general, in one aspect, the invention relates to a method of implementing a system design using a heterogeneous integrated circuit. The method comprising mapping a plurality of special-purpose blocks and a plurality of programmable logic blocks to the system design, configuring the plurality of special-purpose blocks and programmable logic blocks for interfacing with a high-speed mesh interconnect fabric comprising a plurality of interconnect pipeline buses, and configuring at least one of the plurality of interconnect pipeline buses based on a timing requirement and a latency associated with the system design.

DETAILED DESCRIPTION

Figure 1:
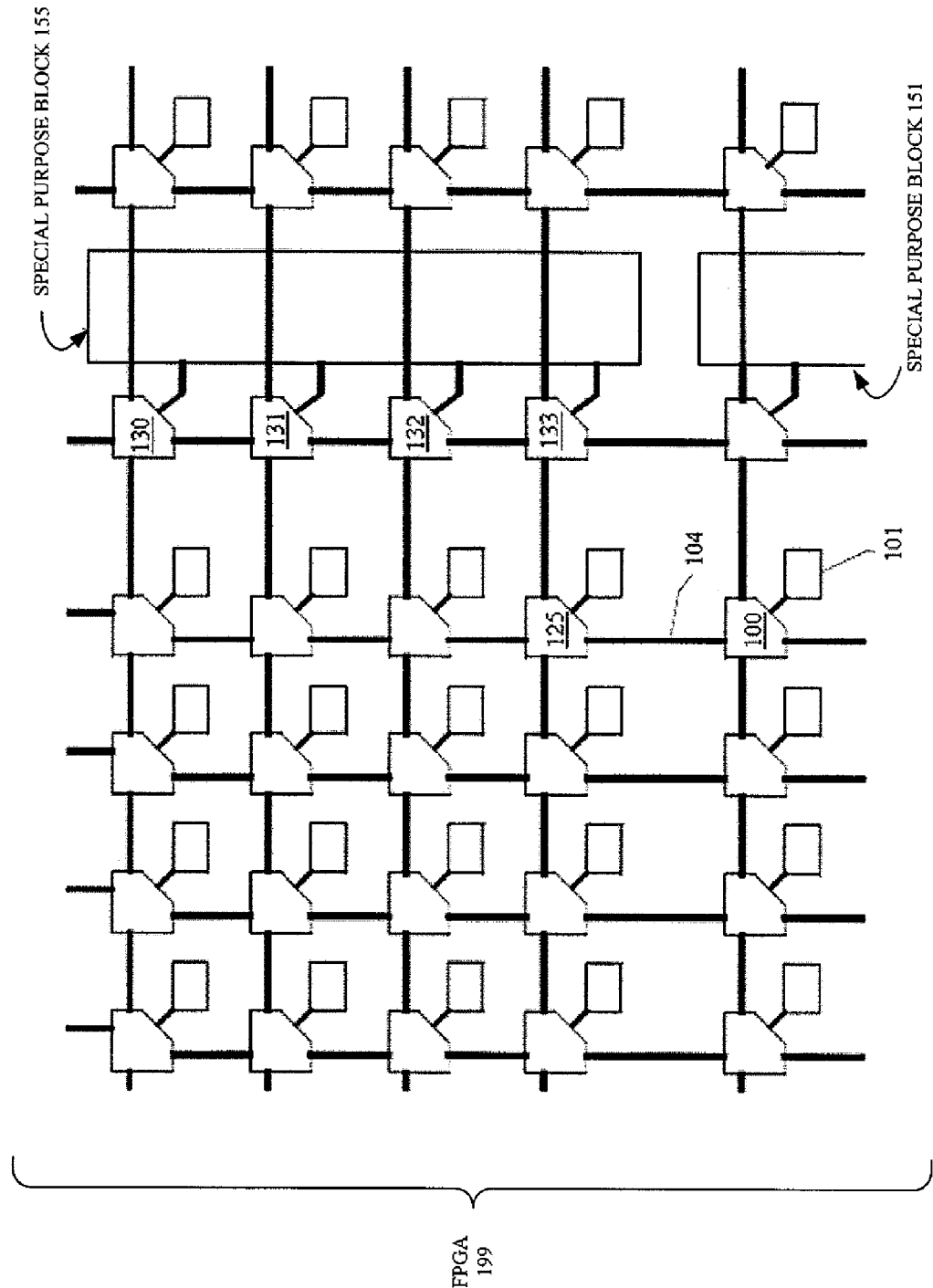
FIG. 1 shows a FPGA in accordance with one or more embodiments of the invention.

An example of the invention will now be described in detail with reference to the accompanying figures. Like elements in the various figures are denoted by like reference numerals for consistency. Further, the use of "ST" in the drawings is equivalent to the use of "Step" in the detailed description below.

In examples of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a heterogeneous configurable integrated circuit. The heterogeneous configurable integrated circuit includes a configurable, pipelined, and multiplexed bus interconnect fabric connecting PLBs, general purpose input/output (GPIO) blocks, memory, memory controllers, special-purpose blocks, and other blocks often found on an FPGA.

FIG. 1 shows an FPGA (199) in accordance with one or more embodiments of the invention. As shown in FIG. 1, the FPGA (199) includes one or more programmable logic blocks (101), one or more configurable special-purpose blocks (151, 155), and one or more routing crossbars (XBARs) (100, 125, 130, 131, 132, 133). Each programmable logic block (101) may include one or more 4-input lookup tables (LUTs) (not shown) and one or more configurable 1-bit sequential cells (not shown). A configurable special-purpose block (151, 155) implements a widely-used function. Those skilled in the art, having the benefit of this detailed description, will appreciate the FPGA (199) may have more than one type of special-purpose block (151, 155).

As also shown in FIG. 1, the routing crossbars (XBARs) (100, 125, 130, 131, 132, 133) form a two-dimensional routing network that provides configurable connections among the logic blocks (101) and the special-purpose blocks (151, 155). Each XBAR may be connected to the nearest-neighbor XBARs in four directions and to either a logic block or a special-purpose block. For example, routing crossbar (125) and routing crossbar (100) are connected by buses (104). Although both logic blocks and special-purpose blocks connect to XBARS, special-purpose blocks are typically much larger than logic blocks and typically have more input and output signals. Accordingly, a special-purpose block may be connected by a plurality of buses to a plurality of XBARs (e.g., special-purpose block (151) is connected to XBARs (130, 131, 132, 133)).

The logic blocks (101), special-purpose blocks (151, 155), and routing crossbars (100, 125, 130, 131, 132, 133) may contain configuration memory bits. A user's design is implemented in the FPGA by setting the configuration memory bits appropriately. Several forms of configuration memory are used by contemporary FPGAs, the most common form being static random-access memory (SRAM).

Figure 2:
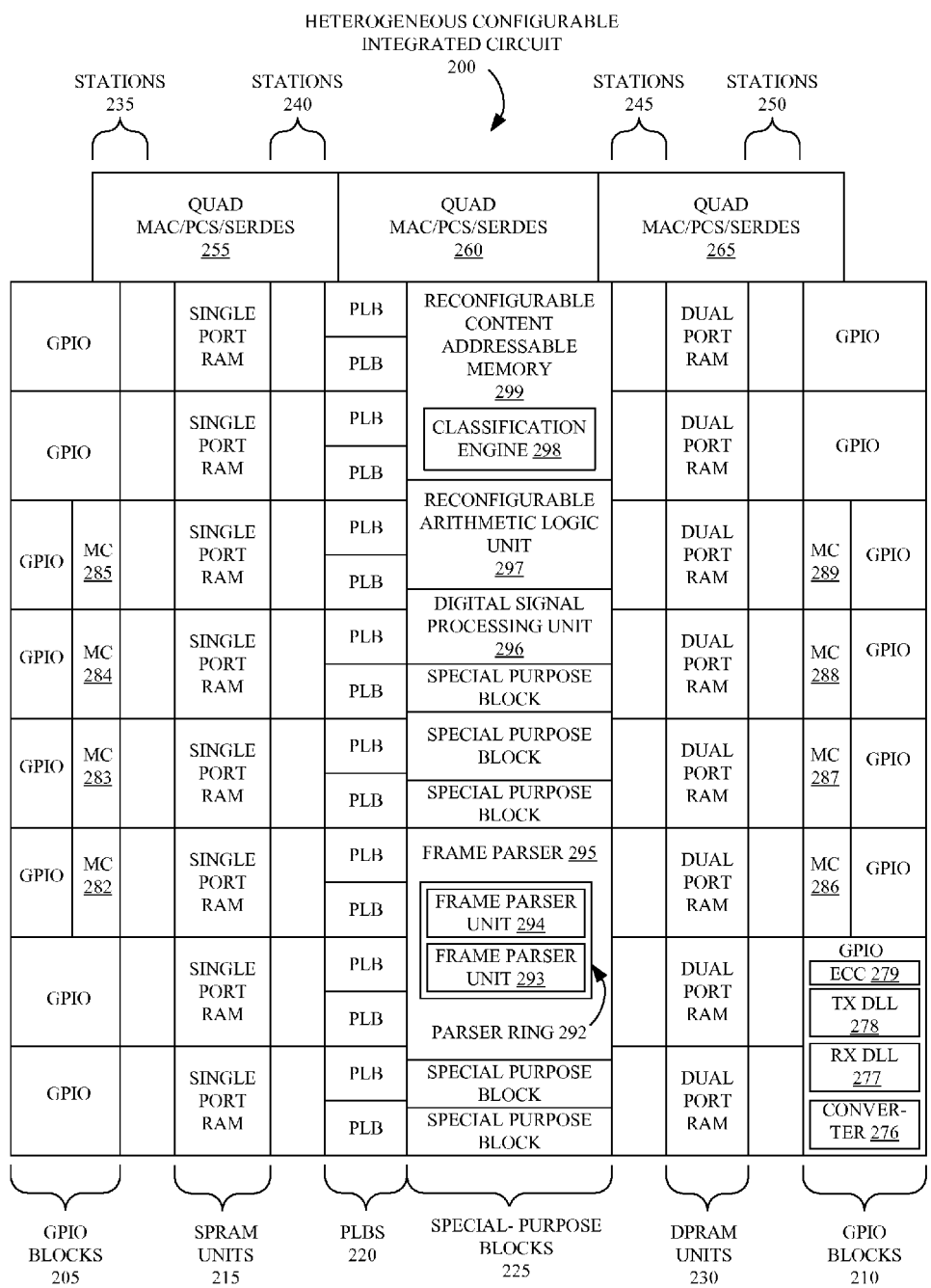
FIG. 2 shows part of a heterogeneous configurable integrated circuit in accordance with one or more embodiments of the invention.

FIG. 2 shows part of a heterogeneous configurable integrated circuit (HCIC) (200) in accordance with one or more embodiments of the invention. As shown in FIG. 2, the HCIC (200) has numerous components including one or more columns of GPIO blocks (205, 210), at least one column of single port ram units (SPRAM) (215), multiple columns of PLBs (220), at least one column of special-purpose blocks (225), at least one column of dual port RAM units (DPRAM) (230), multiple columns of stations (235, 240, 245, 250), and multiple quad Media Access Control, physical coding sublayer, serialize/de-serialize (MAC/PCS/SERDES) units (255, 260, 265) bordering the HCIC (200).

Although FIG. 2 only shows quad MAC/PCS/SERDES units (255, 260, 265) bordering one side of the HCIC (200), those skilled in the art, having the benefit of this detailed description, will appreciate other embodiments of the invention include quad MAC/PCS/SERDES units on multiple sides of the HCIC (200). Additionally, although FIG. 2 only shows a single column of SPRAM units (215), two columns of PLBs (220), and a single column of DPRAM units (230), those skilled in the art, having the benefit of this detailed description, will also appreciate the HCIC (220) may have any number of columns of the mentioned components.

In one or more embodiments of the invention, a special-purpose block (225) is a reconfigurable frame parser unit, a reconfigurable arithmetic unit (RAU), a reconfigurable content addressable memories (RCAM), etc. Although FIG. 2 only shows a single column of special-purpose blocks (225), those skilled in the art, having the benefit of this detailed description, will also appreciate other embodiments of the invention have multiple columns of special-purpose blocks, where each column contains a single type of special-purpose block (i.e., RCAM, RAU, etc.).

In one or more embodiments of the invention, the multiple stations (235, 240, 245, 250) form a data cross-connect (DCC) network. This DCC network is a two-dimensional grid of stations that spans the entire HCIC (200). In one or more embodiments of the invention, the DCC network is as described in U.S. application Ser. No. 11/901,182 entitled "High-Bandwidth Interconnect Network for an Integrated Circuit," which was previously incorporated by reference. In one or more embodiments of the invention, the HCIC (200) also includes a routing crossbar network (not shown) in a plane parallel to the DCC network (discussed in detail below).

Figure 3:
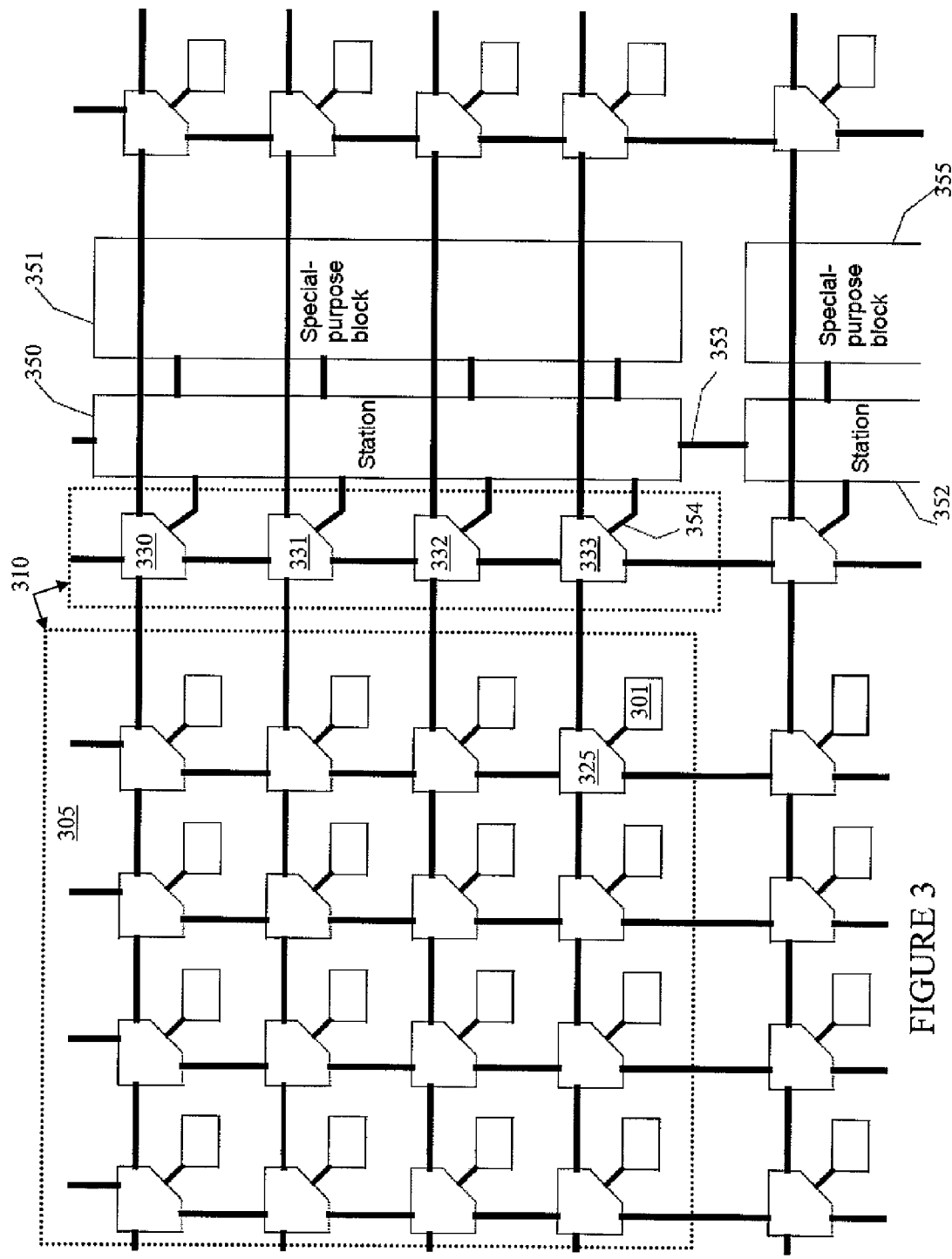
FIG. 3 shows a crossbar network in accordance with one or more embodiments of the invention.

FIG. 3 shows the relationship of the DCC network to the routing crossbar network and to special-purpose blocks in accordance with one or more embodiments of the invention. As shown in FIG. 3, the repeating unit of the routing crossbar network (310) includes a four-by-four array of routing crossbars (305), a PLB attached to each of the routing crossbars in the array (e.g., PLB (301)), and an extra vertical set of four routing crossbars (330, 331, 332, 333). The four extra routing crossbars (330, 331, 332, 333) connect the four-by-four array of routing crossbars (305) to the next group of four-by-four routing crossbars (not shown).

In contrast, the repeating unit of the DCC network is a station (350, 352). In one or more embodiments of the invention, each station (350, 352) has direct connections to the nearest station above it, below it, and to the left and right of it. For example, the station (352) is connected to the neighboring station (350) above it by buses 353. Note that there are horizontal connections between stations, but FIG. 3 does not show them. Typically, each station is connected to one repeating unit of the routing crossbar network using the extra vertical set of four routing crossbars. For example, the station (350) is connected to the repeat unit of the routing crossbar network (310) via the extra vertical set of four routing crossbars (330, 331, 332, 333) using the buses (354). The DCC network may be referred to as a configurable high-speed mesh interconnect fabric.

In one or more embodiments of the invention, each station is also connected to a special-purpose block. The special-purpose blocks (351, 355) are essentially the same as special-purpose blocks (225) discussed above in reference to FIG. 2. For example, the station (350) is connected to the special-purpose block (351) by buses. Multiplexers in the station (not shown) give the special-purpose block access to both the routing crossbar network and the DCC network.

In one or more embodiments of the invention, the HCIC (200) is fabricated on a monolithic semiconductor substrate. The special-purpose blocks (351, 355), the programmable logic blocks (220), and the configurable high-speed mesh interconnect fabric may be disposed on a single plane of the monolithic semiconductor substrate. In other embodiments of the invention, the special-purpose blocks (351, 355) are disposed on a different plane of the monolithic semiconductor substrate than the programmable logic blocks (220) and the DCC network. In other embodiments of the invention, the programmable logic blocks are disposed on a different plane of the monolithic semiconductor substrate than the special-purpose blocks and the DCC network.

In one or more embodiments of the invention, computer-aided design (CAD) software routes a path through the DCC network by configuring switches in the stations. Those skilled in the art, having the benefit of this detailed description, will appreciate this is similar to the process of routing a signal through an FPGA routing network, such as the routing crossbar network. However, unlike an FPGA network, the two-dimensional grid of stations (i.e., the DCC network) provides one pipeline register at each station, which allows the data to flow at a very high rate.

Figure 4:
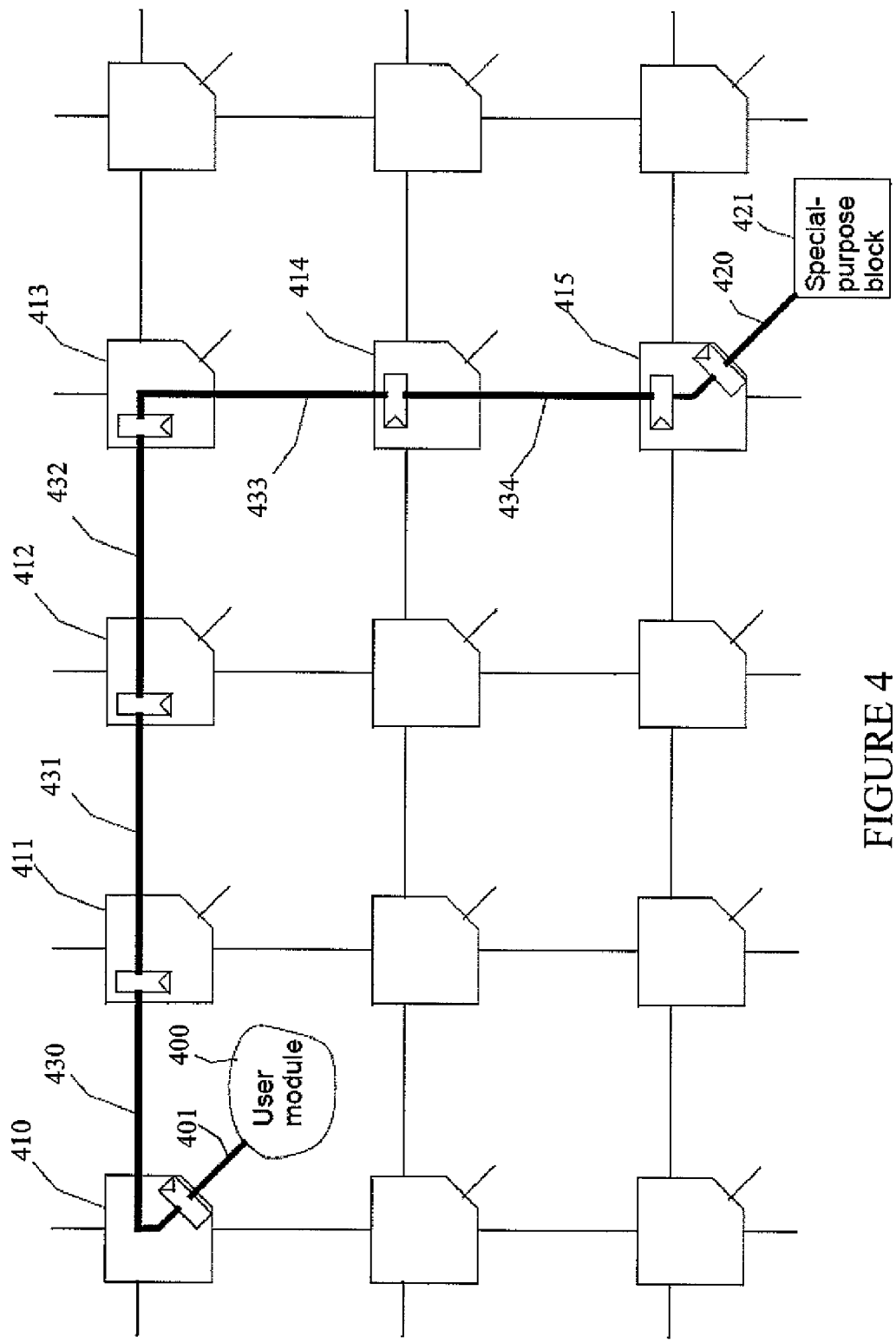
FIG. 4 shows a connection routed through stations in accordance with one or more embodiments of the invention.

FIG. 4 shows a connection routed through a series of stations (410, 411, 412, 413, 414, 415) in accordance with one or more embodiments of the invention. The stations (410, 411, 412, 413, 414, 415) may be essentially the same as stations (350, 352), discussed above in reference to FIG. 3. A user module (400) may be implemented with PLBs. The user module (400) may send data into the two-dimension grid of stations using a routing crossbar-to-station bus (401). In this example, the user module (400) sends eighty-bit-wide data at rate of two hundred MHz. Input-port logic in the station (410) serializes the data to be ten bits wide at a rate of one thousand, six hundred MHz. Data travels from station-to-station over ten-bit buses (430, 431, 432, 433, 434) at one thousand, six hundred MHz, with one pipeline register at each station. At the destination station (415), output-port logic deserializes the data to be forty bits wide and presents it to special-purpose block (421) on the bus (420) at four hundred MHz. The special purpose block (421) may be essentially the same as the special-purpose blocks (351, 355), discussed above in reference to FIG. 3.

Figure 5:
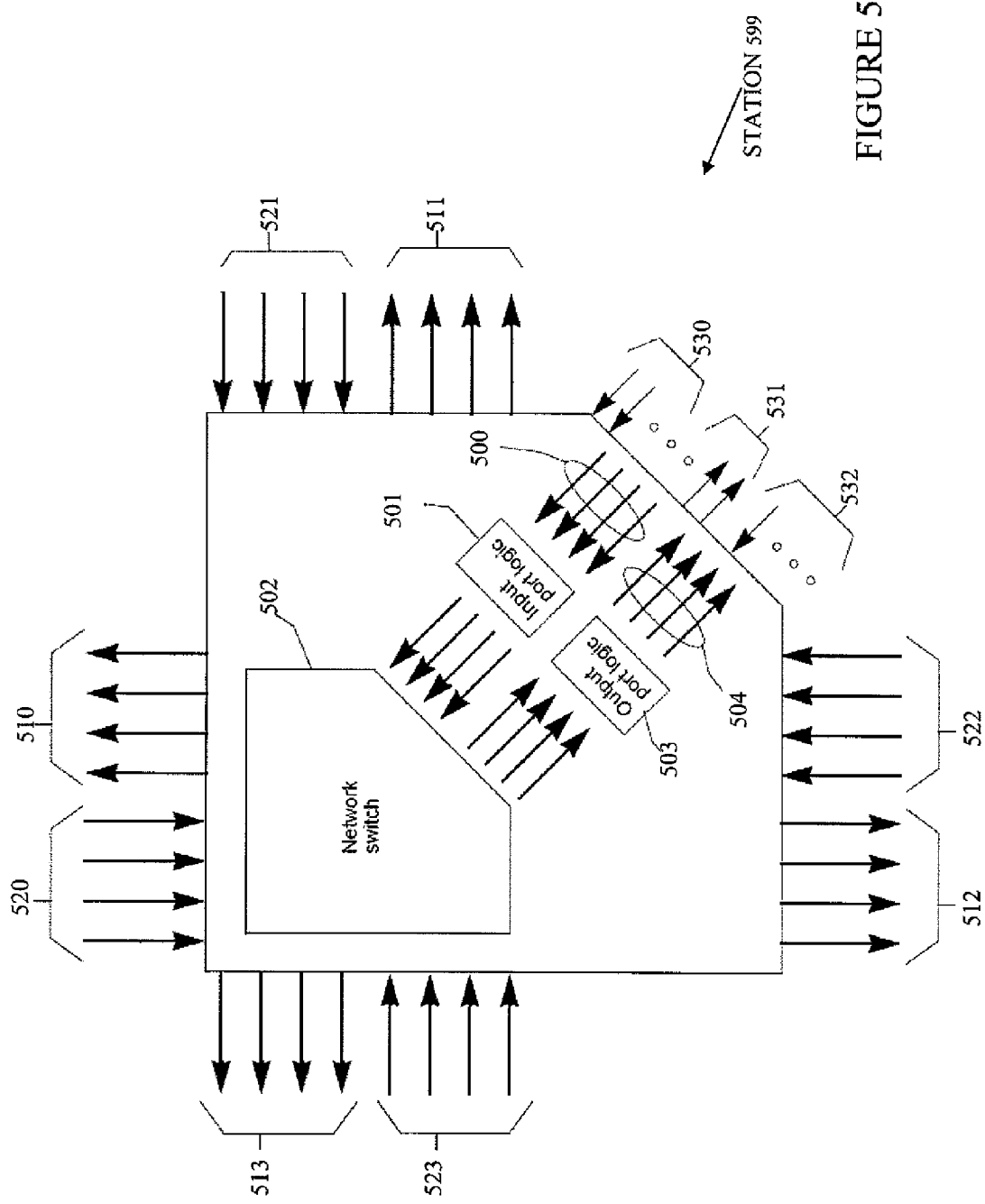
FIGS. 5 and 6 show a station in accordance with one or more embodiments of the invention.

FIG. 5 shows a network-oriented view of a station (599) in accordance with one or more embodiments of the invention. The station (599) may be essentially the same as the stations (350, 352) discussed above in reference to FIG. 3. The station (599) includes four twenty-bit input ports (500), input port logic (501) for processing input data, network switch (502) for passing data from station to station, output port logic (503) for processing output data, and four twenty-bit output ports (504). The station's (599) external connections consist of sixteen five-bit output links (510, 511, 512, 513) to neighboring stations, and sixteen five-bit input links (520, 521, 522, 523) from neighboring stations, many input connections (530) from and output connections (531) to routing crossbars (not shown) and a special-purpose block (not shown), and a small number of clock inputs (532). Some of the clocks may operate at the frequencies of user logic and some operate at the faster internal frequencies of the inventive network.

Figure 6:
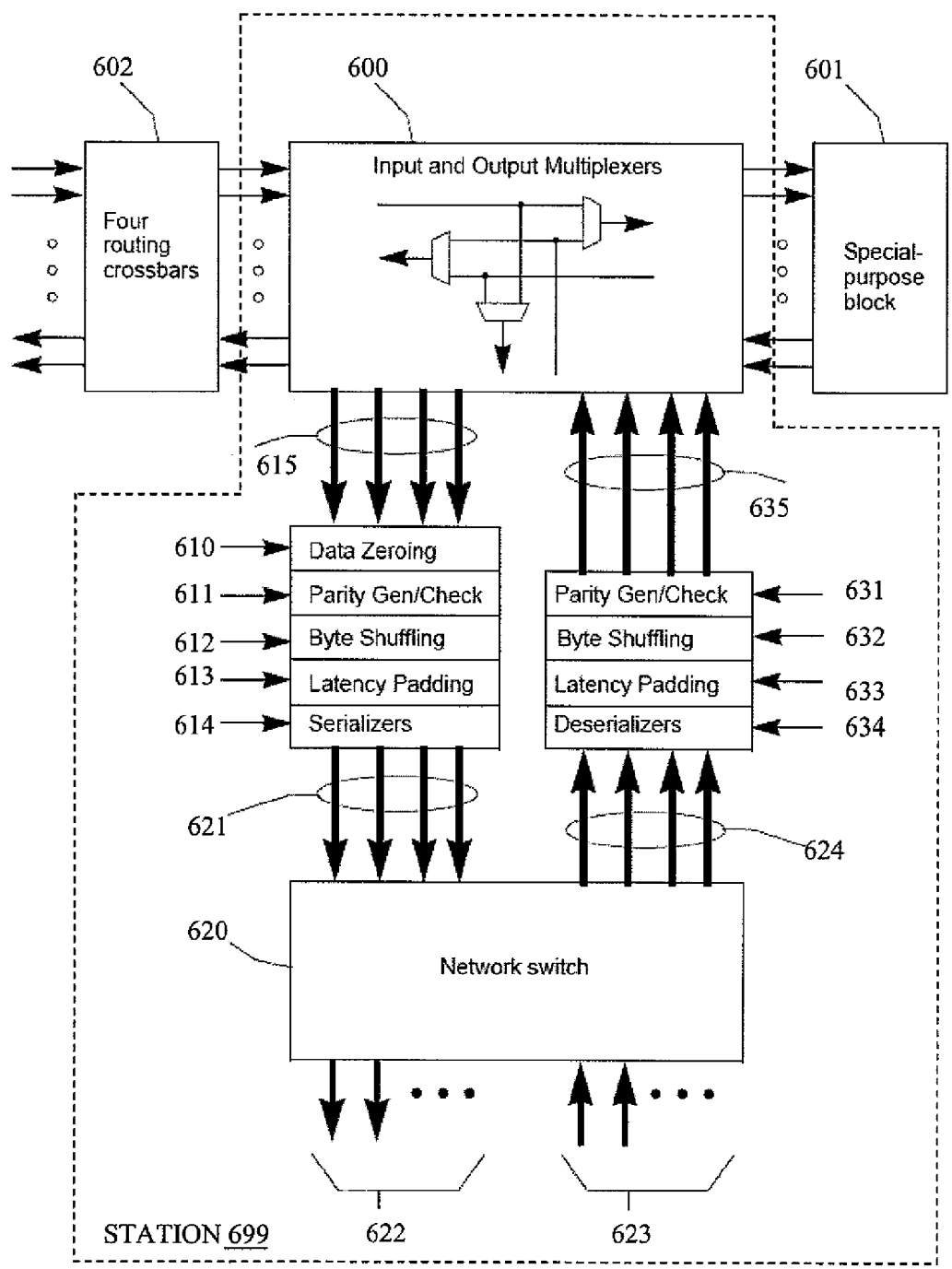

FIG. 6 shows a block diagram of a station (699) in accordance with one or more embodiments of the invention. The station (699) consists of input and output multiplexers (600), five layers of input port logic (610, 611, 612, 613, 614), a network switch (620), and four layers of output port logic (631, 632, 633, 634). The input and output multiplexers (600) give a special-purpose block (601) access to the routing crossbar network through four routing crossbars (602). The input and output multiplexers (600) connect both the special-purpose block (601) and the routing crossbars (602) to the input ports (615) and output ports (635) of the station. Each station has four twenty-bit input ports (615) and four twenty-bit output ports (635).

The input port logic (610, 611, 612, 613, 614) performs a series of functions: data zeroing, parity generation and checking, byte shuffling, latency padding, and serialization.

The data-zeroing logic (610) can dynamically or statically zero out five-bit portions of the twenty-bit user bus. This feature helps implement multiplexers in the inventive network and also allows the use of five, ten, or fifteen bits of the input port instead of all twenty bits.

The parity logic (611) can generate parity over nineteen bits or over two groups of nine bits, and it can check parity over all twenty bits or over two groups of ten bits. Output ports have similar parity logic (631), so parity can be generated or checked at both input ports and output ports.

By default, each twenty-bit input port will be serialized onto one five-bit bundle in the inventive network. This implies a default frequency ratio of 4:1 between the internal clock of the inventive network and the user port clock. When the user requires a 2:1 ratio, the byte-shuffling logic (612) can steer twenty bits of data from one user port toward two internal bundles.

The latency padding logic (613) may add up to fourteen user clock cycles of latency to an input port, and output ports have similar latency padding logic (633). In one or more embodiments of the invention, CAD software uses this logic to pad the end-to-end latency through the inventive network to equal the value specified by the user, largely independent of the number of stations that the data has to pass through.

The last layer in the input port logic is the serializers (614), which serialize each twenty-bit input port at the user clock rate onto a five-bit internal bundle. In the preferred embodiment, internal bundles can be clocked at up to two GHz.

Still referring to FIG. 6, the network switch (620) is a partially populated crossbar switch. It routes five-bit bundles (621) from the four input ports to the sixteen station-to-station output links (622), from the sixteen station-to-station input links (623) to the sixteen station-to-station output links (622), and from the sixteen station-to-station input links (623) to the five-bit bundles (624) that feed the four output ports. The sixteen station-to-station output links 622 may be essentially the same as elements 510-513, discussed above in reference to FIG. 5, and the sixteen station-to-station input links (623) may be essentially the same as elements 520-523, discussed above in reference to FIG. 5. In one or more embodiments of the invention, there is a multi-port OR gate at the root of each routing multiplexer in the switch. If a multiplexer is configured to allow more than one bundle into the OR gate, then the data-zeroing logic at the input ports determines which input bus is allowed through the OR gate. Those skilled in the art, having the benefit of this detailed description, will appreciate such a configuration permits the DCC network to perform cycle-by-cycle selection for applications such as high-bandwidth multiplexers, user crossbar switches, and time-slicing a connection through the inventive network.

Still referring to FIG. 6, the output port logic (631, 632, 633, 634) performs a series of functions that reverse the functions of the input port. The deserializer (634) distributes a five-bit internal bundle onto a twenty-bit output port at the user clock rate. The latency padding logic (633) can add up to fourteen user clock cycles of latency. Byte-shuffling logic (632) can steer data from one internal bundle toward two user output ports, which is often used with a 2:1 clock ratio. The parity logic (631) can generate parity over nineteen bits or two groups of nine bits, and it can check parity over twenty bits or two groups of ten bits. There is no data-zeroing logic in an output port.

Those skilled in the art, having the benefit of this detailed description, will appreciate a DCC network, as discussed in reference to FIGS. 3-6 has several key advantages over traditional FPGA routing networks. One advantage of the DCC network is that user data is serialized and then pipelined across the chip. In the preferred embodiment the pipeline frequency can be as high as two GHz, which is difficult to achieve in an ASIC and impossible to achieve in an FPGA.

The high frequency provides a performance advantage. Another advantage is that the pipeline registers are built into the stations. They do not consume register resources in the logic blocks, which provides an area advantage over FPGAs. Another advantage is that the routing multiplexers in the network switches of the inventive network are configured on a granularity coarser than a single bit. This greatly reduces the number of configuration memory bits and multiplexer ports compared to an FPGA routing network, so it saves a great deal of die area. These three advantages provide enough on-chip bandwidth for high-speed special-purpose blocks to communicate with each other, while needing much less die area than an FPGA to provide equivalent bandwidth.

Referring back to FIG. 2, in one or more embodiments of the invention, at least one column of special-purpose blocks (225) includes a frame parser (295) having one or more frame parser units (293, 294). A frame parser (295) may be optimized for stateless parsing of network packets. A frame parser unit (293, 294) may include a processor specialized for analyzing frame headers, instruction memory, and data memory. The data memory may be allocated partly to store application constants, and partly to store headers and cells. In one embodiment of the invention, the parser engine may execute up to 800 MHz.

In one or more embodiments of the invention, a user can combine one or more abutting frame parser units (293, 294) to form a parser ring (292). The parser ring (292) is customizable with user specific parsing software. In one or more embodiments of the invention, for a given frame, the parser ring (292) outputs both a result and the given frame. In other words, the output may consist of the result pre-pended to the given frame. In one or more embodiments of the invention, for a given frame, the parser ring (292) outputs just a result. In other words, the given frame is discarded.

In one or more embodiments of the invention, multiple parser rings may be cascaded, or concatenated to perform complex parsing. Dual or multiple interconnect outputs from the parser ring (292) may improve packet-dependent processing. Due to the nature of packet data processing, the frame parser (295) is particularly suitable for connecting using the high speed communications fabric.

In one or more embodiments of the invention, the frame parser (295), the frame parser unit (293, 294) and the parser ring (292) are as described in U.S. application Ser. No. 11/855,697 entitled "System and Method for Parsing Frames," which was previously incorporated by reference.

In one in one or more embodiments of the invention, the at least one column of special-purpose blocks (225) includes one or more reconfigurable content addressable memory (RCAM) units (299) having a classification engine (298). An RCAM is configured to perform associative lookups as a binary content addressable memory (CAM), a ternary CAM, or a byte-wise CAM. The RCAM may be used in layer 2-4 (data link layer, network layer, and transport layer) classification of the Open Systems Interconnection (OSI) layer model, and in deep packet inspection. As a data packet is stored in the CAM, the content is addressable and may be inspected for a matching pattern deep inside the data packet quickly. The classification engine (298) is configured to classify a frame based on at least one selected from a group consisting of a header and a payload of the frame. Without the capability of the RCAM, it is only practical to inspect the header or the first few bits of a data packet.

In one or more embodiments of the invention, the RCAM unit (299) is configurable in any combination of the following modes: 64×40 binary CAM mode, which matches exact 1-bit value, and may also be used as a 64×40 single-port SRAM; 64×20 ternary CAM mode, which matches exact 1-bit value or Don't-Care; and 64×36 byte-wise CAM mode, which matches exact 9-bit value or Don't-Care, and includes byte-shifting logic for scanning byte strings. The RCAM unit (299) may include a fully maskable key. Match vectors can be inverted, masked, or reversed before priority encoding. In one or more embodiments of the invention, the RCAM unit (299) performs associative lookups at a rate of up to 1 GHz.

In one or more embodiments of the invention, the RCAM unit (299) includes chaining circuitry that allows it to work together with adjacent RCAM units in the same column. This circuitry allows multiple adjacent RCAM units to implement a wider CAM.

In on or more embodiments of the invention, the RCAM unit (299) is as described in U.S. application Ser. No. 11/855,721 entitled "Reconfigurable Content-Addressable Memory," which was previously incorporated by reference.

In one in one or more embodiments of the invention, at least one column of special-purpose blocks (225) includes one or more reconfigurable arithmetic logic units (RAUs) (297). An RAU (297) is a configurable building block for arithmetic and logic functions. An RAU (297) may include 8-bit computation elements, registers, and multiplexers. Adjacent RAU blocks can work together to form a configurable compute fabric with 8-bit granularity. The RAU (297) may be used for a wide variety of functions, including, e.g., Cyclic Redundancy Check (CRC) calculation, hashing, Galois field arithmetic, packet editing (e.g., inserting, deleting, replacing bytes, and the like), arithmetic operations (e.g., signed and unsigned multiplication, addition/subtraction, checksum, and the like), and logic operations (e.g., Programmable Logic Arrays (PLAs), finite-state machines, and the like). In accordance with embodiments of the invention, pipelined performance of a RAU (297) may reach to half that of the DCC (e.g., the RAU (297) may run at a clock frequency of 1 GHz nominally).

In one in one or more embodiments of the invention, at least one column of special-purpose blocks (225) includes one or more Packet Editors (PED). A Packet Editor may modify, delete, insert and/or replace one or more fields of an incoming packet. Depending on the network processing application such functions may be performed at bit level, byte level, or some combination of the two.

In one in one or more embodiments of the invention, the at least one column of special-purpose blocks (225) includes one or more Digital Signal Processing Engines (DSPE) (296) for Voice over IP (VoIP) applications. The DSPE is a full-fledged processor, comprising, among other things, instruction memory, data memory, address and data registers, and a multiplier unit. In such applications, incoming data streams may be routed directly to the DSPE (296) where a standard voice pay load is trans-coded and compressed into packet voice by an algorithm running in the DSPE (296) (i.e., a vocoder algorithm). In one or more embodiments of the invention, the digital signal processing engine (296) is configured to perform at least one selected from a group consisting of voice compression, telephony signaling, video compression, and echo cancellation.

In one or more embodiments of the invention, the MAC units of the Quad MAC/PCS/SERDES blocks (255, 260, 265) provide a set of features for Ethernet and Fibre Channel. The MAC unit is implemented as a hard macro to reduce power consumption and die area. The PCS may implement different coding, for example, 8B/10B coding, for multiple standards. The SERDES units of the Quad MAC/PCSISERDES blocks (255, 260, 265) perform serialization, clock and data recovery, and de-serialization. The MAC and PCS or just the MAC may be bypassed allowing for the use of PLB logic and SERDES to implement protocols that are not supported by the MAC and PCS (e.g., Peripheral Component Interconnect (PCI) Express and Synchronous Optical Network (SONET)). The Quad MAC/PCS/SERDES blocks (255, 260, 265) may also include diagnostic features including built-in self-test and internal loopback. Each Quad MAC/PCS/SERDES block (255, 260, 265) provides multiple, preferably four, channels for serial communications, and may directly implements Ethernet and Fibre Channel up to the MAC layer. In one embodiment of the invention, six quad blocks are included for a total of 24 serial channels.

In one example, the four channels of the Quad MAC/PCS/SERDES blocks (255, 260, 265) may be used as four Ethernet channels or four Fibre Channels. The data rate of each Ethernet channel may be 10/100/1000 Mbps. The data rate of each Fiber Channel may be 1/2/4 Gbps. Each channel has its own MAC, PCS, and SERDES units. Each channel may be configured independently for different data rates. The four channels may be used together for ten-gigabit attachment unit interface (XAUI) to 10 Gbps Ethernet physical layers (PHY). In XAUI operation, one 10 Gbps MAC connects to all four lanes of PCS/SERDES, and each lane has a signaling rate of 3.125 Gpbs.

In one or more embodiments of the invention, the HCIC (200) includes one or more memory controllers (MC) (i.e., MC (289), MC (288), MC (287), MC (286), MC (285), MC (284), MC (283), MC (282)) operatively connected to one or more special-purpose blocks (225) and/or one or more programmable logic blocks (220). The memory controller (i.e., MC (289), MC (288), MC (287), MC (286), MC (285), MC (284), MC (283), MC (282)) issues command sequences, such as read and write command sequences, to external memories (i.e., external to the HCIC (200)). Network applications often use external memory to hold large amounts of data, such as routing tables or packets. The speed of accessing external memory may be a bottleneck. The performance of the HCIC (200) may be improved by way of the dedicated memory controller (i.e., MC (289), MC (288), MC (287), MC (286), MC (285), MC (284), MC (283), MC (282)). Data transfer to and from memory may be in burst mode, i.e., data is transmitted without waiting for input from another device or waiting for an internal process to terminate.

The memory controller (i.e., MC (289), MC (288), MC (287), MC (286), MC (285), MC (284), MC (283), MC (282)) is a configurable, hard macro block that works with GPIO blocks (205, 210) to implement an interface to off-chip memory. The memory controller (i.e., MC (289), MC (288), MC (287), MC (286), MC (285), MC (284), MC (283), MC (282)) performs address and control functions while the GPIO blocks (205, 210) implement the data path functions such as Double Data Rate (DDR), First In First Out (FIFO) functions, and error checking and correction (ECC) functions. In order to accommodate different memories, the bank width of the memory controller may be configurable, for example, from 8 to 72 bits. The memory controller (i.e., MC (289), MC (288), MC (287), MC (286), MC (285), MC (284), MC (283), MC (282)) supports different memory interfaces, including double data rate including DDR and DDR2, quad data rate including QDR and QDR II, and reduced latency DRAM including RLDRAM and RLDRAM II.

In one or more embodiments of the invention, the memory controller (i.e., MC (289), MC (288), MC (287), MC (286), MC (285), MC (284), MC (283), MC (282)) is as described in U.S. application Ser. No. 11/855,740 entitled: "Memory Controller for Heterogeneous Configurable Integrated Circuit," which was previously incorporated by reference.

In one or more embodiments of the invention, the HCIC (200) includes at least one column of DPRAM units (230). Each DPRAM unit (230) is a configurable dual-port memory, and operates as either a static RAM or a FIFO. In one or more embodiments of the invention, the performance of the DPRAM unit reaches half the speed of the interconnect system, e.g., 1 GHz nominally. The DPRAM unit (230) may optionally include output registers. In a dual-port RAM operation, each port performs a read or a write operation in every cycle. Burst mode may be implemented to allow high-speed RAM access controlled by slower PLB logic. Depth and width of each port is also be configured. The FIFO mode uses built-in address counters and full/empty logic. Speculative pushes and pops are permitted with rollback to a prior committed state. NEAR_FULL and NEAR_EMPTY signals may have configurable watermarks.

In one or more embodiments of the invention, the HCIC (200) includes at least one column of SPRAM units (215). An SPRAM block may be formed from a collection of SPRAM units (215). Configurable connections among the internal RAMs may partition the SPRAM block into a plurality of independent static RAMs or FIFOs with configurable depth and width. The SPRAM units (215) may include many configurable features to assist high-performance network and storage processing applications. In one embodiment of the invention, the performance of the SPRAM units (215) reaches half the speed of the interconnect system, e.g., 1 GHz nominally. The SPRAM units (215) may be configured to operate as a pseudo-dual-port RAM at a slower speed, e.g., 500 MHz. Burst mode may also be implemented for SPRAM units (215) to allow high-speed RAM access under the control of a slower PLB logic. The FIFO mode of SPRAM may also use built-in address counters and full/empty logic. Speculative pushes and pops are allowed with rollback to a prior committed state. NEAR_FULL and NEAR_EMPTY signals may have configurable watermarks. Both the RAM and FIFO modes may have built-in ECC and parity logic.

In one or more embodiments of the invention, the HCIC (200) includes multiple PLBs (220) forming a flexible, LUT-based fabric for implementing combinatorial and sequential logic. The PLB fabric may be connected through the interconnect system (i.e., the DCC network and the routing crossbars network) to form a chip-wide logic fabric. Each of the PLBs (220) may include a plurality of registers configurable as flip-flops or latches, and may have flexible set/reset and clock options. Each PLB may include a plurality of LUTs. Paired LUTs may be formed using direct feed-forward connections to achieve wider functions. Dedicated multiplexers may be included to form 5-input LUTs from paired 4-input LUTs. The LUTs may be implemented with 4-bit fast carry chain for addition and subtraction. Two-port memory cells may be included in addition to the LUTs to implement RAMs.

In one or more embodiments of the invention, the HCIC (200) includes a plurality of flexible GPIO blocks (205, 210) for supporting a variety of I/O standards. The GPIO blocks (205, 210) may have flexible drive and termination options to simplify board design. Each GPIO block (205, 210) is connected to two pads. A GPIO block (205, 210) can implement two single-ended signals or one differential signal. The GPIO blocks (205, 210) provide support for popular network interfaces such as System Packet Interface (SPI) 4.2, XGMII, and XSBI, and for popular memory interfaces such as DDR2, QDR II, and RLDRAM II.

In one or more embodiments of the invention, the GPIO blocks (205, 210) are configured for input, output, or bidirectional use. The GPIO block pins may be configured to support single-ended standards such as High-Speed Transceiver Logic (HSTL) Class I/II/III at 1.5 V, Stub-Series-Terminated-Logic-for-1.8V (SSTL_18) and Stub-Series-Terminated-Logic-for-2.5V (SSTL_25) class I/II, Low voltage CMOS (LVCMOS) at 1.5/1.8/2.5V, and Gunning Transceiver Logic Plus (GTLP). For pseudo-differential operation, the GPIO blocks (205, 210) have one amplifier for each pad to compare a single-ended input voltage with a reference voltage. The GPIO pins may also be configured in pairs to support differential standards such as LVDs at 2.5 V for SPI 4.2, and Lightning Data Transport (LDT) for HyperTransport 1.1. The drive strength may also be configurable, e.g., from 2 mA to 24 mA. Slew rate control, Process, Voltage, and Temperature (PVT) compensation and impedance-matching may optionally be implemented. On-die termination may be matched to external resistors. Routing to GPIO blocks (205, 210) may be implemented through the PLB fabric to allow flexible pin assignments.

In one embodiment of the invention, the GPIO blocks (205, 210) include built-in logic functions in order to improve system performance and conserve PLB resources. The built-in functions include error correcting code logic (eg., ECC 279) having a plurality of exclusive-OR (XOR) gates in each GPIO block (205, 210). The XOR gates of many adjacent GPIO blocks (205, 210) are connected together to form a plurality of XOR tress, which can perform error checking and correction using error correcting codes (ECC) for data exchanged with the external memory. The built-in functions may also include registers for double data rate/single data rate (DDR/SDR) conversion (i.e., converter (276)), additional registers configurable as flip-flops or latches, 16-deep FIFOs for clock-domain crossing, one or more transmit delay lock loops (Tx DLLs) (e.g., TX DLL (278)) and per-bit receive delay lock loops (Rx DLLs) (e.g., RX DLL (277)) to de-skew source-synchronous buses, and at-speed logic to generate, check, and correct ECC for off-chip memory.

In one or more embodiments of the invention, the GPIO blocks (205, 210) are as described in U.S. application Ser. No. 11/855,761 entitled "General Purpose Input/Output System and Method," which was previously incorporated by reference.

The HCIC (200) includes a flexible and precise clock distribution system, formed from multiple PLLs and a network of clock buffers. The PLLs may include built-in logic for frequency multiplication and division. The PLLs may drive the clock of the interconnect system up to 2 GHz. The PLLs or the PLB fabric may drive a plurality of global clock networks. Local clock buffers may then be driven by the global clock networks or the PLB fabric. Local clock dividers may be provided to generate clocks with a fixed frequency ratio to a source clock. Clock edges stay aligned for low skew. Local clock dividers are useful for interfacing PLB logic and special-purpose blocks to the DCC, and they reduce the need for global clock networks.

The HCIC (200) must be configured prior to use. Different options exist for configuring the HCIC (200). For example, a dedicated configuration port, general-purpose I/O pins, or a JTAG port may be used for the configuration step. The JTAG port may also provide test functions subsequent to the configuration step.

In one or more embodiments of the invention, the HCIC (200) includes a configuration controller (not shown) for use in configuring the HCIC (200). The configuration controller is configured to receive a bit stream of configuration information to configure the HCIC (200). Various configuration modes may be implemented. For example, a master serial mode may use an Serial Peripheral Interface (SPI) configuration memory which may store the configuration information, a slave serial mode may be used for configuration by an external processor which may provide the configuration information, an 8-bit parallel mode using GPIO pins may achieve faster configuration by the external processor, and a JTAG mode may be used for configuration through the JTAG port. The master and slave serial modes support daisy-chain configuration of a plurality of circuits (e.g., HCIC (200)). CRC error checking may be performed to ensure data integrity of the bit stream of configuration information. To ensure design security, bit stream configuration data that was encrypted using Advance Encryption Standard (AES) can be decrypted on-chip using a key stored in non-volatile memory cells. A compression option may be utilized to reduce the size of the bit stream configuration information.

In one or more embodiments of the invention, the JTAG port may support user-accessible test modes including boundary scan, memory Built-In Self-Test (BIST), and the like. In addition, JTAG commands may allow full configuration of the HCIC (200), and may be capable of configuring a single electronic circuit or multiple electronic circuits in a daisy chain. Partial reconfiguration, read back of configuration memory and functional registers, and in-system programming of SPI configuration memory may also be performed through the JTAG port.

Figure 7:
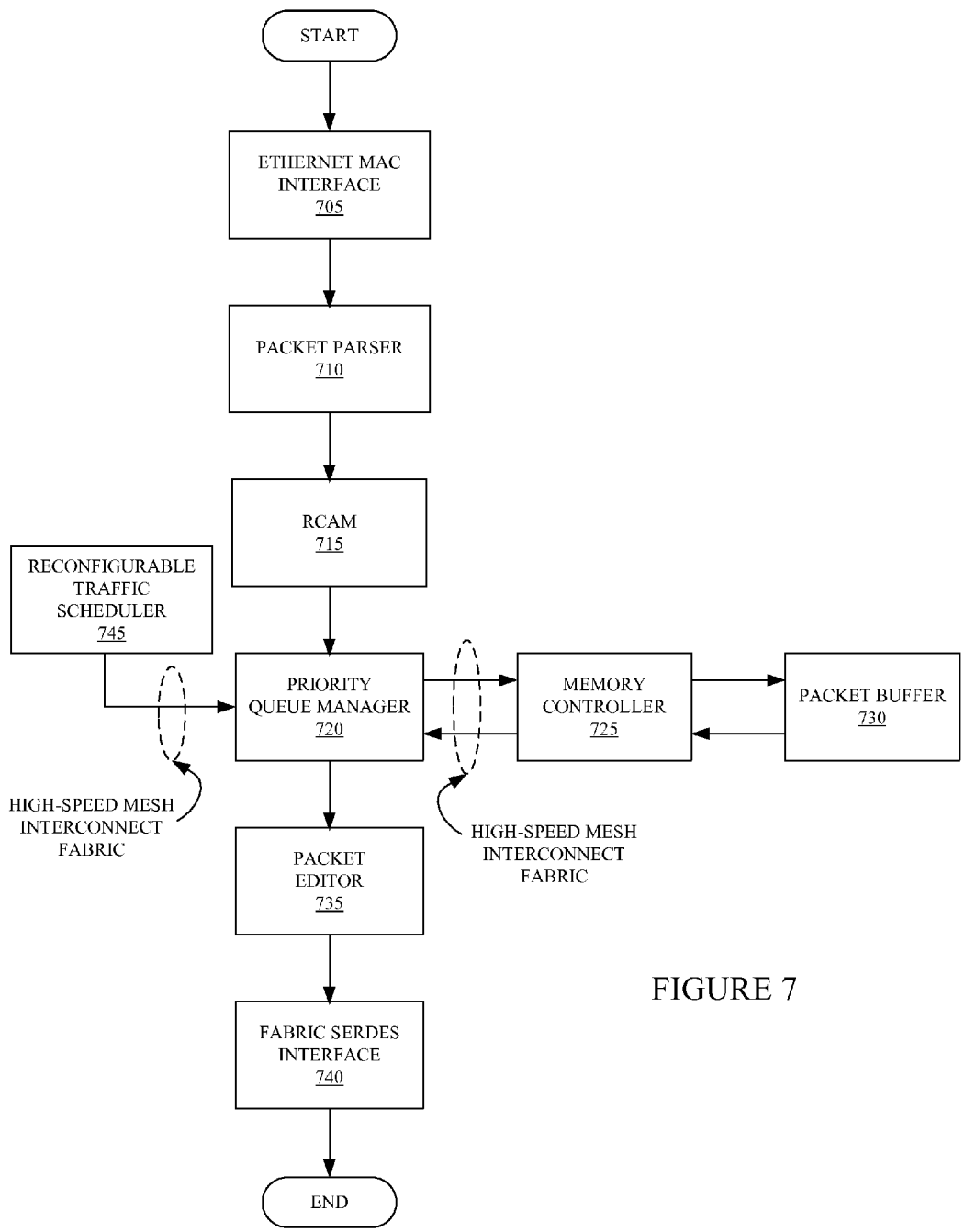
FIG. 7 shows an example in accordance with one or more embodiments of the invention.

FIG. 7 shows an example in accordance with one or more embodiments of the invention. The example shown in FIG. 7 represents a line card application. In this example, network packet traffic is received via the Ethernet MAC Interface (705), temporarily stored in a packet buffer (730), and then re-transmitted from the packet buffer (730) to the backplane interface via the SERDES interface (740).

The intervening processing components along the receive processing pipeline include the packet parser (710), the RCAM (715), the priority queue manager (720), and the memory controller (725). The packet parser (710) extracts important fields from the packet header while the RCAM (715) uses the extracted fields to perform packet classification using table look-up. The priority queue manager (720) assigns the packet to a specific priority queue in the packet buffer (730), while the memory controller (725) performs the actual transfer of the packet into and out of the packet buffer (730).

Packet transmission out of the packet memory (730) is initiated by the reconfigurable traffic scheduler (745), which implements specific policies and algorithms to ensure that the quality-of-service requirements are fulfilled and that processing resources are fairly allocated to users. The reconfigurable traffic scheduler (745) can be implemented using a combination of PLBs and RAUs. A traffic shaper (not shown) may be used to smooth outgoing packet bursts.

The remaining intervening blocks along the transmit processing pipeline include the packet editor (735) and the fabric SERDES interface (740). The main function of the packet editor (735) is to modify the outgoing packet, for example, by appending new packet headers such as Ethernet MAC, or appending a packet trailer such as an Ethernet CRC. The SERDES fabric (740) serializes the frame data prior to sending the packet to the backplane.

Traffic between the various blocks may be transported over the DCC network, or indirectly via a transit DPRAM or SPRAM buffer when, for example, the transmit and receive clocks are not synchronized.

In one or more embodiments of the invention, the host interface (not shown) supports the control plane signaling functions for application such as MPLS/IP. Accordingly, the host processor can dynamically update the contents of the RCAM (715) look-up table entries which determine the path followed by each individual packet as part of packet classification. The ability to dynamically update these RCAM table entries is the real key to supporting applications such as MPLS enhanced resilience services, wherein traffic can dynamically and seamlessly be re-routed through a different transmission path in response to link failure or congestion. More importantly, these RCAM updates can be invoked in a hitless manner, which means other active traffic channels are unaffected by the change.

Those skilled in the art, having the benefit of this detailed description, will appreciate the interconnect fabric may be used advantageously to form a reconfigurable high speed communication fabric connecting PLBs and special-purpose blocks in an FPGA to improve the operating speed and narrow the performance gap between the FPGA and an ASIC.

Those skilled in the art, having the benefit of this detailed description, will appreciate applications of the HCIC (200) include, but are not limited to, switching and routing for network or mass storage devices, broadband aggregation, security and content inspection, optical transport, telecommunication, wireless base station, network processing unit (NPU), and layer 4-7 (transport layer, session layer, presentation layer, and application layer of the OSI layer model) applications.

Those skilled in the art, having the benefit of this detailed description, will appreciate that network applications involving packet processing may use circuit configurations to accommodate the latency and take advantage of the high speed communications fabric connecting PLBs and special-purpose blocks in the FPGA. Further, in these network applications, a significant fraction of the FPGA processing power need to be devoted to packet parsing. The use of PLBs to achieve special-purpose functions, though flexible, is not optimal in performance. In some embodiments of the invention, by dedicating the special-purpose blocks to special-purpose functions such as packet parsing, the overall performance of the FPGA may be further improved.

Those skilled in the art, having the benefit of this detailed description, will also appreciate including special-purpose blocks (225) on the monolithic semiconductor substrate has many advantages. For example, complex network functionalities such as layer 2-4 classification and deep packet inspection or Ethernet and Fibre Channel implementation up to MAC layer may be delivered using a single integrated circuit to reduce system component count, the functionalities may be performed with higher performance to improve system throughput, the FPGA resource utilization rate may be increased to reduce system cost, among other advantages.

While the invention has been described with respect to a limited number of embodiments, those skilled in the art, having the benefit of this disclosure, will appreciate that other embodiments can be advised or achieved which do not depart from the scope of the invention as disclosed herein. Accordingly, the scope of the invention should be limited only by the attached claims.

What is claimed is:

1. A system comprising:
a plurality of programmable logic blocks;
a plurality of special-purpose blocks;
a configurable high-speed mesh interconnect fabric operatively connecting the plurality of programmable logic blocks and the plurality of special-purpose blocks, wherein the configurable high-speed mesh interconnect fabric is configured to implement a plurality of interconnect pipeline buses spanning across the system;
a memory controller operatively connected to the plurality of special-purpose blocks and the plurality of programmable logic blocks using the high-speed mesh interconnect fabric, wherein the memory controller is configured to transfer data between an external memory and at least one selected from a group consisting of the plurality of special-purpose blocks and the plurality of programmable logic blocks; and
a general purpose input/output block operatively configured to transfer data between the external memory and at least one selected from a group consisting of the memory controller, the plurality of special-purpose blocks, and the plurality of programmable logic blocks,
wherein the general purpose input/output block comprises:
a converter for executing a double data rate to single data rate conversion of the transferred data;
a transmit delay lock loop for de-skewing source-synchronous signals associated with the transferred data;
a receive delay lock loop for de-skewing source-synchronous signals associated with the transferred data; and
error correcting code logic for error detection and error correction of the transferred data.

2. The system of claim 1, wherein the configurable high-speed mesh interconnect fabric operates at a first clock frequency and a special-purpose block of the plurality of special-purpose blocks operates at a second clock frequency.

3. The system of claim 1, wherein the configurable high-speed mesh interconnect fabric operates at a first clock frequency and a programmable logic block of the plurality of programmable logic blocks operates at a second clock frequency.

4. The system of claim 1, wherein a special-purpose block of the plurality of special-purpose blocks is a frame parser comprising a plurality of frame parser units forming a parser ring, wherein each of the plurality of frame parser units is controlled using a dedicated instruction memory.

5. The system of claim 1, wherein a special-purpose block of the plurality of special-purpose blocks is a reconfigurable content addressable memory comprising a classification engine configured to classify a frame based on at least one selected from a group consisting of a header and a payload of the frame.

6. The system of claim 1, farther comprising:
a single port ram unit; and
a double port ram unit,
wherein at least one selected from a group consisting of the single port ram unit and the double port ram unit is accessible to the plurality of special-purpose blocks and the plurality of programmable logic blocks using the high-speed mesh interconnect fabric.

7. The system of claim 1, farther comprising:
a packet buffer; and
a priority queue manager operatively connected to the high-speed mesh interconnect fabric and configured to manage a packet stored in the packet buffer to satisfy a quality of service guarantee.

8. The system of claim 1, further comprising:
a reconfigurable traffic scheduler operatively connected to the high-speed mesh interconnect fabric and accessible by at least one selected from the group consisting of the plurality of special-purpose blocks and the plurality of programmable logic blocks for satisfying a plurality of quality of service treatments.

9. The system of claim 1, wherein a special-purpose block of the plurality of special-purpose blocks is a packet editor configured to modify a packet by performing at least one selected from a group consisting of a bit transformation and a byte transformation on the packet.

10. The system of claim 1, wherein a special-purpose block of the plurality of special purpose blocks is a reconfigurable arithmetic logic unit configured to perform at least one selected from a group consisting of cyclic redundancy check, hashing, and checksum.

11. The system of claim 1, wherein a special purpose block of the plurality of special purpose blocks is a digital signal processing unit configured to perform at least one selected from a group consisting of voice compression, video compression, telephony signaling, and echo cancellation on an incoming packet.

* * * * *